United States Patent [19]

Hendrickson et al.

[11] Patent Number: 5,778,968
[45] Date of Patent: Jul. 14, 1998

[54] METHOD FOR HEATING OR COOLING WAFERS

[75] Inventors: Ruth Ann Hendrickson, Lincoln, Mass.; Christopher Hofmeister, Hampstead, N.H.; Richard S. Muka, Topsfield, Mass.

[73] Assignee: Brooks Automation Inc., Chelmsford, Mass.

[21] Appl. No.: 654,334

[22] Filed: May 28, 1996

Related U.S. Application Data

[62] Division of Ser. No. 169,432, Dec. 17, 1993, abandoned.

[51] Int. Cl.$^6$ ................................................ F25B 29/00
[52] U.S. Cl. ...................... 165/80.1; 165/80.2; 165/80.4; 165/80.5; 156/345; 118/725
[58] Field of Search ........................ 165/80.1, 80.2, 165/80.4, 80.5; 156/345; 118/725

[56] References Cited

U.S. PATENT DOCUMENTS

| 4,261,762 | 4/1981 | King | 148/1.5 |
|---|---|---|---|
| 4,367,114 | 1/1983 | Steinberg et al. | 156/345 |
| 4,544,446 | 10/1985 | Cady | 156/639 |
| 4,680,061 | 7/1987 | Lamont, Jr. | 148/1.5 |
| 4,838,978 | 6/1989 | Sekine et al. | 156/345 |
| 4,903,754 | 2/1990 | Hirscher et al. | 165/1 |
| 4,963,713 | 10/1990 | Horiuchi et al. | 219/121.43 |
| 5,009,738 | 4/1991 | Gruenwald et al. | 156/345 |
| 5,060,354 | 10/1991 | Chizinsky | 29/25.02 |
| 5,090,900 | 2/1992 | Rudolf et al. | 432/239 |
| 5,199,483 | 4/1993 | Bahng | 165/1 |
| 5,304,279 | 4/1994 | Coultas et al. | 156/345 |
| 5,411,076 | 5/1995 | Matsunaga et al. | 165/80.2 |

*Primary Examiner*—John K. Ford
*Attorney, Agent, or Firm*—Perman & Green, LLP

[57] ABSTRACT

Gas-loaded thermal conditioning is used to cause the temperature of a substrate to approach that of a high thermal inertia temperature-controlled plate by adjustable pressure of gas above the substrate, so as to press the substrate against the plate. There is no mechanical contact with the substrate except the plate which it rests on, and there is no danger of overheating or overcooling.

8 Claims, 2 Drawing Sheets

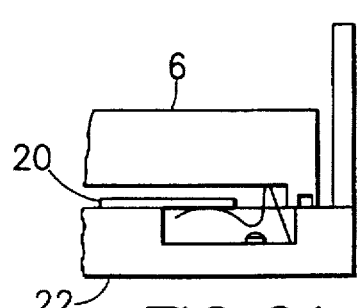 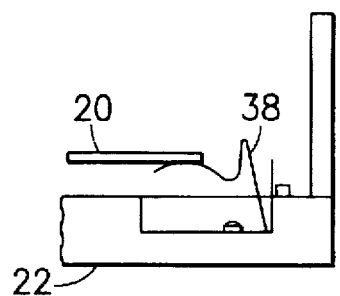
FIG.2A  FIG.2B
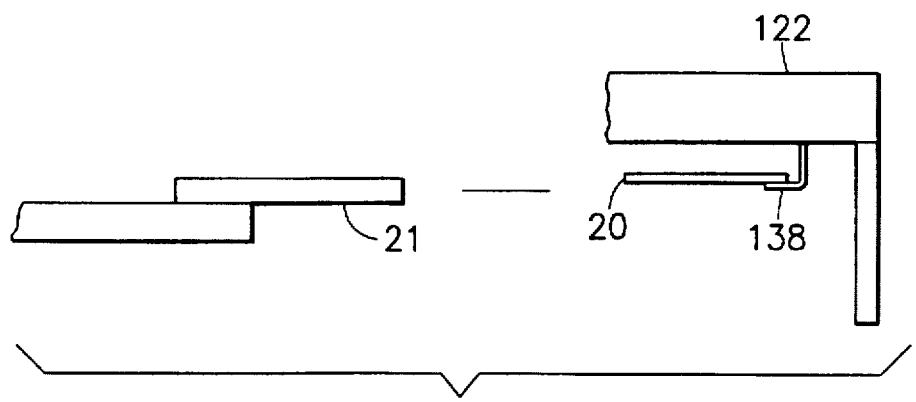
FIG.2C
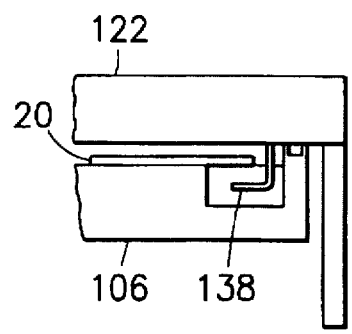
FIG.2D

METHOD FOR HEATING OR COOLING WAFERS

This is a divisional of application Ser. No. 08/169,432 filed on Dec. 17, 1993 now abandoned.

BACKGROUND OF THE INVENTION

1. Field of the Invention

The apparatus of the present invention relates generally to processing of substrates, such as semiconductor wafers or glass panels for flat panel displays, and in particular to apparatus for heating or cooling such substrates during processing steps which are carried out in vacuum.

2. Description of the Prior Art

Various methods and apparatus are known for heating or cooling semiconductor wafers during processing in high vacuum. For example, U.S. Pat. No. 4,261,762 to King discloses a method and apparatus for providing heat conduction between an article being treated in a vacuum and a support member by providing a gas under pressure of about 0.5 to 2.0 Torr between the article and the support member. U.S. Pat. No. 4,680,061 to Lamont, Jr. discloses a similar method and apparatus. A somewhat different apparatus for heat treating and cooling semiconductor material is disclosed in U.S. Pat. No. 5,060,354 to Chizinsky. It is also known to heat wafers by radiation, such as radiation from lamps. Prior art apparatus which employ mechanical contact with the wafer, such as clamps, during the heating or cooling process, are subject to certain difficulties. For example, any such mechanical contact results in particle generation and causes localized stress and, potentially, fractures. Lamps can overheat the wafers.

SUMMARY OF THE INVENTION

The present invention comprehends the use of gas-loaded thermal conditioning, wherein the temperature of a wafer is caused to approach that of a high thermal inertia temperature-controlled plate by adjustable pressure of gas above the wafer, so as to press the wafer against the plate. There is no mechanical contact with the wafer except the plate which it rests on, and there is no danger of overheating or overcooling. The process is simple, clean, programmable, makes use of instrumentation, and is safe. Moreover, gases such as water and volatiles which evolve from the wafer are removed without turbulence by the flow of pressurizing gas at a low rate, such as a rate which exchanges the few hundred $cm^2$ gas volume every five seconds (insufficient for convection heat transfer).

The process is programmable, since the thermal rate is based on pressure and difference in pressure, so that use may be made of instruments such as a gas-flow meter to provide a mass flow controller in conjunction with a pressure transducer. In addition to the gas flow above the wafer, there is constant evacuation between the wafer and the plate, so that the absolute pressure is low but the pressure difference is high. The gas load provides a strong force because of the relatively large area over which the pressure difference operates.

The invention may best be understood from the following detailed description of preferred embodiments thereof, having reference to the drawings, in which:

BRIEF DESCRIPTION OF THE DRAWINGS

FIGS. 2A, 2B, 2C, and 2D are detail views taken from FIG. 1 which, in vertical section, illustrate successive relative positions of the components thereof.

DETAILED DESCRIPTION OF THE INVENTION

Figure 1:
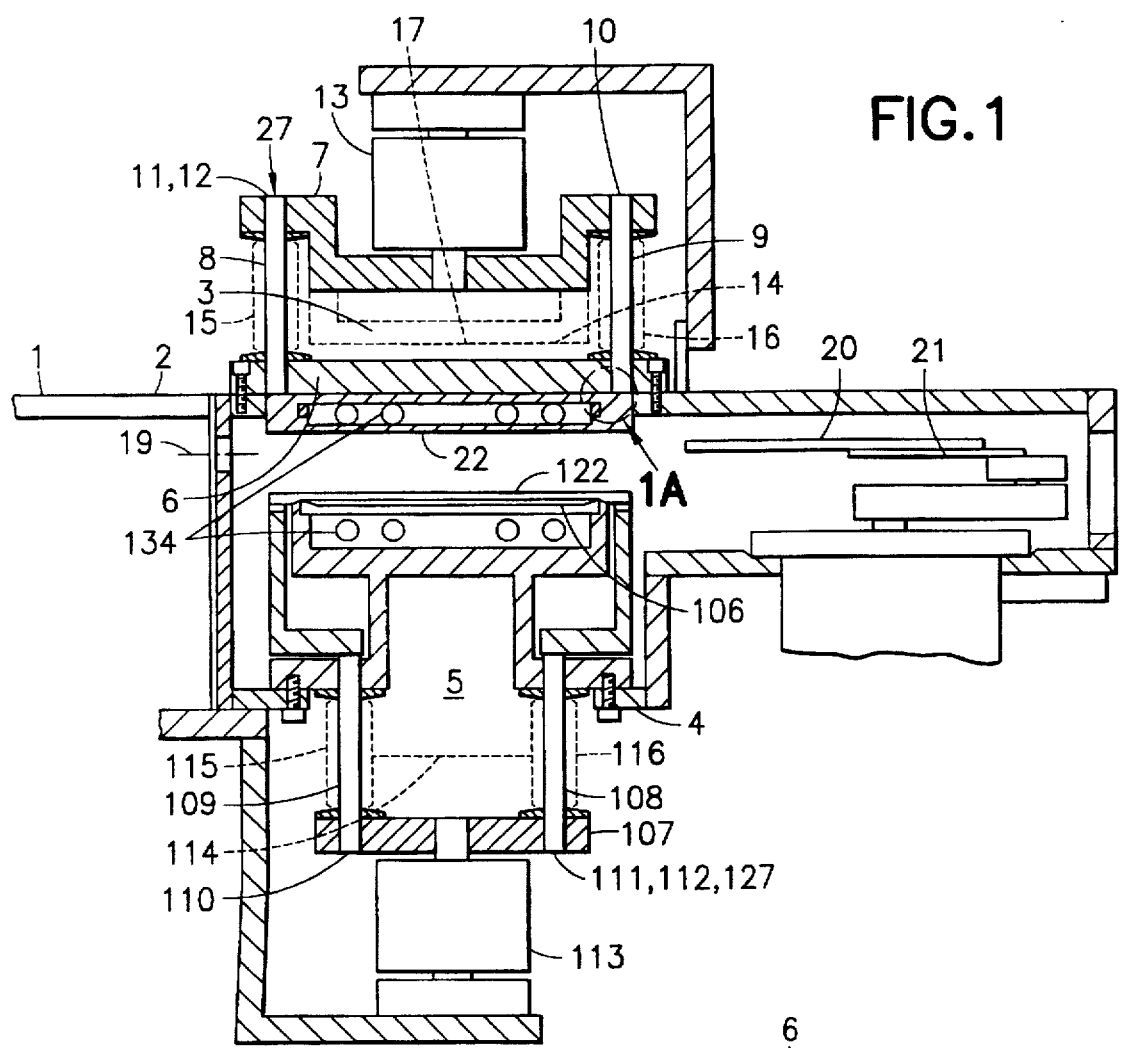
FIG. 1 is a view in vertical section of apparatus for heat transfer by contact.
Figure 1A:
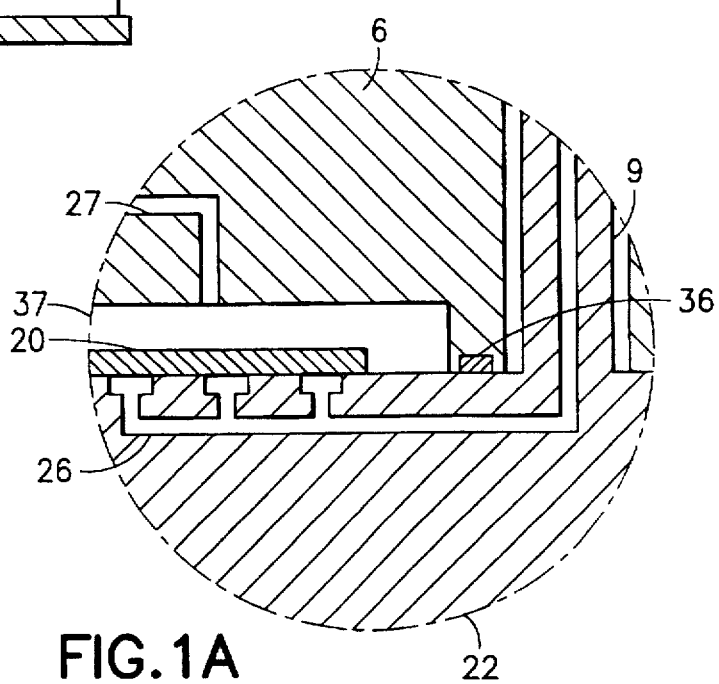
FIG. 1A is a detail vertical section view of a part of FIG. 1.

Referring to the drawings, and first to FIG. 1 thereof, the device therein shown can heat or cool, in a vacuum environment, semiconductor wafers or substrates or other similar items. It features a vacuum chamber (with associated vacuum and venting control system containing two modules. Each module includes a thermal plate that is heated or cooled to the selected temperature, a means of applying a vacuum to the back side of a wafer placed on the thermal plate, and a means of inletting into the chamber inert gas such as argon at a controlled flow rate or pressure. It also has a means of evacuating the inert gas and any other gasses which might evolve from the wafer during conditioning and returning the chamber to a high vacuum. In normal use, the assembly would be mounted within a larger vacuum chamber that is maintained in a high vacuum state.

An important new feature of this thermal conditioning assembly is the ability to provide, in a vacuum environment, closed-loop, profiled heating or cooling to a selected temperature. The rate of heating or cooling is controlled by the pressure differential between the argon or other inert gas pressing against the top of the wafer and the vacuum applied to the bottom of the wafer. This pressure differential, which is under closed-loop control, establishes good thermal contact between the wafer and the heat/cool plate. The greater the pressure differential, the better the thermal contact and, consequently, the more rapid the change in the wafer's temperature. The final temperature achieved by the wafer is determined by the thermal plate's selected temperature, which is also under closed-loop control.

Another important feature is its environmental isolation. The assembly's vacuum chamber opens only when the high vacuum condition has been re-established, which prevents the evolution of any gases released during thermal conditioning into the surrounding vacuum environment.

A typical use for the module in heating mode is for degassing wafers. Under normal operation for this purpose, the wafer would be brought to the target temperature at a rate controlled by the top-side pressure, and then the module chamber would be evacuated to high vacuum. In the absence of the good thermal path provided by the top-side pressure, the wafer temperature would remain very close to the temperature of the thermal plate, which would continue to hold at the target temperature. In other words, just as the good mechanical contact between wafer and plate gives good thermal conductivity, the absence of any such mechanical contact and the presence of only a slowly flowing gas gives a poor thermal path above the wafer. The degassing wafer would be retained in the module vacuum chamber for a long enough time to ensure that most of the gasses had been removed by the module vacuum pump. At that point, the module chamber could be opened for wafer transfer without introducing unwanted gasses into the surrounding high vacuum environment.

A third important feature of the invention is the modular nature of the invention which allows multiple modules to be configured within one larger vacuum environment. One such configuration (shown in FIG. 1) would be to mount the modules one above the other in such a way that, when open at alternate times, they would present the wafer to the same transfer plane. This would allow two wafers to be conditioned and then accessed asynchronously at different times from the same wafer transfer plane. The ability to access the wafers alternately allows the thermal conditioning of one wafer to continue while the other wafer is being conditioned. This effectively doubles the number of wafers per hour that can be conditioned, compared to a single chamber.

Referencing FIG. 1, the vacuum chamber 1 includes an upper wall 2 having an upper aperture 3 and a lower wall 4 having a lower aperture 5 which is aligned opposite to the upper aperture 3. Each of said apertures 3,5 accommodates a module for moving a temperature-controlled plate (upper) or wafer support plate (lower) vertically between a wafer-transport plane and a heat or cool position (heat shown). An upper module 6 is supported in the upper aperture 3, and includes an upper lift bar 7, two upper lift rods 8,9, and upper conduits 10,11,12,27 for vacuum, electrics, H$_2$O, and argon, respectively. The upper lift rods are raised and lowered by an upper pneumatic cylinder 13, so that the upper lift bar moves through a stroke distance as shown at 14. Upper vacuum seals 15,16 are provided for the upper lift rods and the upper conduits, which move linearly with respect thereto.

Initially, for wafer exchange, the upper lift bar 7 is in the lower position, as shown by the broken lines 17, so that the upper wafer support 22 (which includes the upper cool or upper degas plate) is also in the lower position, which lower position is below the wafer transport plane 19. A wafer 20 is moved by the robot end effector 21 in the wafer transport plane 19 to a position above the upper wafer support 22, so that the upper wafer support 22 is able to engage the wafer 20. The robot end effector 21 is then retracted, and the upper lift bar 7 is raised to the upper position, as shown by the solid lines, so that the upper wafer support 22 is also in the upper (or heat/cool) position.

The lower module 106 is similar to the upper module. The lower module is supported in the lower aperture 5, and includes a lower lift bar 107, two lower lift rods 108,109, and lower conduits 110,111,112 and 127 for vacuum, electrics, H$_2$O, and argon, respectively. The lower lift rods 108,109 are raised and lowered by a lower pneumatic cylinder 113, so that the lower lift bar 107 moves through a stroke distance as shown at 114. Lower vacuum seals 115,116 are provided for the lower lift rods and the lower conduits, which move linearly with respect thereto.

For the upper module, the upper aperture 3 is opened and closed by moving the wafer support plate 22 which forms a poppet valve. The sequence of operation is as follows:

First, load wafer, close poppet while at high vacuum. The step of loading the wafer includes the introduction of the wafer 20 through a suitable slot in the wafer transport plane and the elevation (or descent) thereof through the stroke distance to the operative location. Once in the operative location, the wafer is supported on a wafer support plate 22, which contains a temperature-control means (such as a heater or water cooling). The temperature of the cooled plate is controlled by water circulated therethrough at a controlled temperature. The space between the wafer support plate 22 and the wafer 20 is evacuated by a vacuum line 26. The space above the wafer is connected to the argon line 27.

Second, backfill with argon on wafer topside while vacuum pumping underside.

Third, wafer heats or cools.

Fourth, evacuate argon.

Fifth, open poppet and unload wafer. For degas operation, the heater is used. For cooling, the heater is deleted, and water cooling is used.

The sequence of operation may be seen more clearly with reference to FIGS. 1 and 2. Referring thereto, vacuum-tightness of the vacuum chamber 1 is ensured by the use of upper bellows 15,16 in connection with the movement of the upper lift rods 8,9 and by the use of lower bellows 115,116 in connection with the movement of the lower lift rods 108,109. In FIG. 1 the upper module 6 could be a cool module and the lower module 106 a degas module. Accordingly, the upper plate 22 is a cooled plate including a chamber for cooling water. The upper surface of the plate 22 has channels 26 within which vacuum is maintained so that the wafer 20 is pulled towards the plate 22. In the "up" position the plate pushes against an O-ring seal 36 in the poppet 22, which forms a chamber 37 into which argon gas is introduced under pressure so that the wafer 20 is pushed against the plate 22. FIG. 2B shows two positions of the upper module when it is being loaded with a wafer (after having loaded the lower module). The middle portion of FIG. 2B shows the cooled plate 22 in the "open" or "down" position, and the upper portion of FIG. 2B shows the cooled plate 22 in the "closed" or "up" position. As may be seen in the middle portion of FIG. 2B, when the cooled plate 22 is in the "down" position, the wafer 20 may be placed thereon by the robot end effector 21 so that it rests on spring members 38 (FIG. 2B). As may be seen in the upper portion of FIG. 2B, when the cooled plate 22 is moved up into the "up" position (FIG. 2A), it pushes against the member 6, causing the spring members 38 to yield and allow the wafer 20 to come in contact with the cooled plate 22. As shown in the lower portion of FIG. 2B, the mount 122, having been loaded with a wafer, is in the "down" position during the above-described movement of the cooled plate 22.

In FIG. 1, the lower plate 106 is a heated plate including a series of lamp heaters 134. The upper surface of the plate 106 has channels similar to 26 within which vacuum is maintained so that the wafer 20 is pulled towards the plate 106. In the "down" position the lower mount 122 pushes against an O-ring seal similar to 36 in the plate 106, which forms a chamber similar to 37 into which argon gas is introduced under pressure so that the wafer 20 is pushed against the plate 106. FIG. 2A shows two positions of the lower module when it is being loaded with a wafer (after having loaded the upper module). The middle portion of FIG. 2A shows the lower mount 122 in the "open" or "up" position, and the lower portion of FIG. 2A shows the lower mount 122 in the "closed" or "down" position. As may be seen in FIG. 2C, when the lower mount 122 is in the "up" position, the wafer 20 may be placed upon brackets 138 mounted below the lower mount 122 by the robot end effector 21 so that it rests on said brackets 138. As may be seen in the lower portion of FIG. 2A, when the lower mount 122 is lowered into the "down" position, the wafer 20 comes to rest upon the heated plate 106 (FIG. 2D), so that the brackets 138 are lowered slightly more than the wafer 20, and the wafer 20 now rests upon the heated plate 106 and no longer upon the brackets 138. As shown in the upper portion of FIG. 2A, the cooled plate 22, having been loaded with a wafer, is in the "up" position during the above-described movement of the mount 122.

Having thus described the principles of the invention, together with illustrative embodiments thereof, it is to be understood that, although specific terms are employed, they are used in a generic and descriptive sense, and not for purposes of limitation, the scope of the invention being set forth in the following claims.

We claim:

1. A method of stabilizing the temperature of semiconductor wafers to a selected target temperature comprising the steps of:

(a) maintaining at a selected target temperature the temperature of first and second high thermal inertia plates each having a flat surface for reception thereon of a semiconductor wafer;

(b) positioning the first thermal plate at an initial wafer receiving position;

(c) placing a first semiconductor wafer on the flat reception surface of the first thermal plate when the first thermal plate is positioned at the initial wafer receiving position;

(d) moving the first thermal plate with the first semiconductor wafer thereon from the initial wafer receiving position to a final thermal conditioning position whereat the first semiconductor wafer is located inside a sealable first chamber associated with thermal conditioning apparatus;

(e) introducing an inert pressurized gas into the first chamber for pressing the first semiconductor wafer uniformly across its surface against the flat reception surface of the first thermal plate for a period of time until the temperature of the first semiconductor wafer is substantially the same as that of the first thermal plate;

(f) upon the conclusion of step (d), positioning the second thermal plate at an initial wafer receiving position;

(g) placing a second semiconductor wafer on the flat reception surface of the second thermal plate when the second thermal plate is positioned at the initial wafer receiving position;

(h) moving the second thermal plate with the second semiconductor wafer thereon from the initial wafer receiving position to a final thermal conditioning position whereat the second semiconductor wafer is located inside a sealable second chamber associated with the thermal conditioning apparatus; and (i) introducing an inert pressurized gas into the second chamber for pressing the second semiconductor wafer uniformly across its surface against the flat reception surface of the second thermal plate for a period of time until the temperature of the second semiconductor wafer is substantially the same as that of the second thermal plate.

2. A method as set forth in claim 1 wherein step (c) includes the step of:

(j) delivering the first semiconductor wafer onto the first thermal plate from a remote location; and wherein step (g) includes the step of:

(k) delivering the second semiconductor wafer onto the second thermal plate from a remote location.

3. A method as set forth in claim 1 wherein step (d) includes the step of:

(j) isolating the first chamber from the environment when the first thermal plate is in the final position; and wherein step (h) includes the step of:

(k) isolating the second chamber from the environment when the second thermal plate is in the final position.

4. A method as set forth in claim 1 wherein step (c) includes the step of:

(j) selectively affixing the first semiconductor wafer to the first thermal plate by applying vacuum to an undersurface thereof; and wherein step (h) includes the step of:

(k) selectively affixing the second semiconductor wafer to the second thermal plate by applying vacuum to an undersurface thereof.

5. A method as set forth in claim 1 wherein step (a) includes the step of:

(j) raising the temperature of the first and second thermal plates to the selected target temperature.

6. A method as set forth in claim 1 wherein step (a) includes the step of:

(j) lowering the temperature of the first and second thermal plates to the selected target temperature.

7. A method as set forth in claim 1 including the steps of:

(j) evacuating the first chamber after the temperature of the first semiconductor wafer has substantially achieved the selected target temperature; and (k) evacuating the second chamber after the temperature of the second semiconductor wafer has substantially achieved the selected target temperature.

8. A method as set forth in claim 1 wherein the initial wafer receiving location is at a transfer plane common to both the first and second thermal plates when each of the first and second thermal plates is in its respective initial wafer receiving position.

* * * * *